(12) United States Patent
Maede

(10) Patent No.: US 8,395,870 B2
(45) Date of Patent: Mar. 12, 2013

(54) INPUT/OUTPUT CIRCUIT

(75) Inventor: Masato Maede, Kyoto (JP)

(73) Assignee: Panasonic Corporation, Osaka (JP)

( * ) Notice: Subject to any disclaimer, the term of this patent is extended or adjusted under 35 U.S.C. 154(b) by 6 days.

(21) Appl. No.: 13/289,696

(22) Filed: Nov. 4, 2011

(65) Prior Publication Data

US 2012/0049939 A1 Mar. 1, 2012

Related U.S. Application Data

(63) Continuation of application No. PCT/JP2010/000020, filed on Jan. 5, 2010.

(30) Foreign Application Priority Data

Jun. 2, 2009 (JP) .................................. 2009-132824

(51) Int. Cl.
*H02H 9/00* (2006.01)
*E02H 1/00* (2006.01)

(52) U.S. Cl. ............ 361/56; 361/111; 327/537; 327/77; 326/82; 326/83

(58) Field of Classification Search ..................... 361/56, 361/54, 58, 91.1, 111; 327/77, 108, 112, 327/537; 326/82, 83
See application file for complete search history.

(56) References Cited

U.S. PATENT DOCUMENTS

| | | | |
|---|---|---|---|
| 6,011,409 A * | 1/2000 | Huang et al. | 326/83 |
| 6,351,364 B1 * | 2/2002 | Chen et al. | 361/111 |
| 6,552,583 B1 * | 4/2003 | Kwong | 327/112 |
| 7,268,592 B2 * | 9/2007 | Tanishima | 327/77 |
| 7,477,496 B2 * | 1/2009 | Kwon | 361/56 |
| 7,692,905 B2 * | 4/2010 | Hung | 361/56 |
| 7,855,862 B1 * | 12/2010 | Gallagher et al. | 361/56 |
| 7,924,539 B2 * | 4/2011 | Ishizuka et al. | 361/56 |
| 7,929,264 B2 * | 4/2011 | Kim | 361/56 |
| 8,035,937 B2 * | 10/2011 | Kwak | 361/56 |
| 8,085,518 B2 * | 12/2011 | Chaudhary et al. | 361/56 |
| 2003/0071662 A1 * | 4/2003 | Kwong | 327/112 |
| 2003/0227904 A1 * | 12/2003 | Rabinovich et al. | 370/352 |

FOREIGN PATENT DOCUMENTS

| | | |
|---|---|---|
| JP | 04-181813 | 6/1992 |
| JP | 05-199097 | 8/1993 |
| JP | 06-077812 | 3/1994 |
| JP | 2001-160615 | 6/2001 |
| JP | 2007-214420 | 8/2007 |

* cited by examiner

*Primary Examiner* — Vibol Tan
(74) *Attorney, Agent, or Firm* — McDermott Will & Emery LLP

(57) ABSTRACT

An output transistor bias generation circuit which applies a bias voltage to one of two NMOS transistors constituting an output circuit having a stack structure, includes diode-connected NMOS transistors provided between an external connection pad connected to an external signal line having a voltage higher than a power supply voltage of an LSI circuit, and the gate of an NMOS transistor, diode-connected NMOS transistors provided between the gate of the NMOS transistor and a ground line, a diode-connected NMOS transistor provided between the power supply line and the gate of the NMOS transistor, and a capacitor-connected NMOS transistor provided between the gate of the NMOS transistor and the ground line.

17 Claims, 7 Drawing Sheets

INPUT/OUTPUT CIRCUIT

CROSS-REFERENCE TO RELATED APPLICATIONS

This is a continuation of PCT International Application PCT/JP2010/000020 filed on Jan. 5, 2010, which claims priority to Japanese Patent Application No. 2009-132824 filed on Jun. 2, 2009. The disclosures of these applications including the specifications, the drawings, and the claims are hereby incorporated by reference in their entirety.

BACKGROUND

The present disclosure relates to input/output circuits which are connected to an external signal line having a voltage higher than the power supply voltage of an LSI circuit.

In interfaces such as an inter-integrated circuit (I2C) bus, an external signal line (bus) of an LSI circuit is pulled up with a resistor, an input/output circuit having an open-drain circuit of an N-channel MOS transistor outputs only a low voltage, and a high voltage is obtained by a pull-up resistor at the terminal end. The pull-up resistor may pull a voltage up to a value (a maximum of 5 V) higher than the power supply voltage of the LSI circuit. Therefore, an input/output circuit which is connected to an external signal line having a voltage higher than the power supply voltage of the LSI circuit is essentially required. However, the voltage of the external signal line higher than the power supply voltage of the LSI circuit is likely to cause a problem with the reliability of the gate oxide film of the MOS transistor included in the input/output circuit, such as time-dependent dielectric breakdown (TDDB), hot carrier injection (HCI), etc.

To address the reliability problem, there is a known MOS transistor protective circuit having a stack structure which is conventionally used as an input/output circuit which is connected to an external signal line having a voltage higher than the power supply voltage of an LSI circuit. In addition, a single or a plurality of diodes or MOS transistor switches are connected between the gate and drain of a MOS transistor included in the protective circuit with a stack structure to accommodate a surge voltage (see Japanese Patent Publication No. 2001-160615).

However, in the above conventional input/output circuit, if a signal having a specific frequency is input to a pad for external connection, a problem arises with the reliability of the gate oxide film. Specifically, the gate voltage of a MOS transistor connected to the external connection pad is raised by a coupling capacitance between the drain and gate of the MOS transistor, so that the voltage of another MOS transistor in the stack structure which is connected in series to the MOS transistor connected to the external connection pad, is likely to exceed the breakdown level, and therefore, the gate oxide film is likely to be damaged.

SUMMARY

The present disclosure describes implementations of an input/output circuit which is connected to an external signal line having a voltage higher than the power supply voltage of an LSI circuit and in which even if a signal having a specific frequency is input to an external connection pad, the reliability of the gate oxide film can be ensured.

An example input/output circuit for an LSI circuit having an external connection pad, includes an input circuit connected to the external connection pad, and an output circuit connected to the external connection pad. The output circuit includes a first and a second N-channel MOS transistor provided between the external connection pad and a ground line of the LSI circuit, and connected together in series, where the first N-channel MOS transistor is closer to the external connection pad and the second N-channel MOS transistor is closer to the ground line, and an output transistor bias generation circuit configured to supply, to the gate of the first N-channel MOS transistor, a voltage which is determined by a voltage of the external connection pad and a voltage of a power supply line of the LSI circuit. The output transistor bias generation circuit includes a first diode element provided between the external connection pad and the gate of the first N-channel MOS transistor, a second diode element provided between the gate of the first N-channel MOS transistor and the ground line, a third diode element provided between the power supply line and the gate of the first N-channel MOS transistor, and a capacitive element provided between the gate of the first N-channel MOS transistor and the ground line.

According to the example input/output circuit of the present disclosure, even when a signal having a specific frequency which has a voltage higher than the power supply voltage of the LSI circuit is applied to the external connection pad, the output transistor bias generation circuit including the first to third diode elements and the capacitive element allows all of the gate-drain voltages, gate-source voltages, and drain-source voltages of the first and second N-channel MOS transistors to be lower than or equal to the voltage of the power supply line of the LSI circuit, whereby the reliability of the gate oxide film can be ensured.

DETAILED DESCRIPTION

Embodiments of the present disclosure will be described hereinafter with reference to the accompanying drawings.

<<First Embodiment>>

Figure 1:
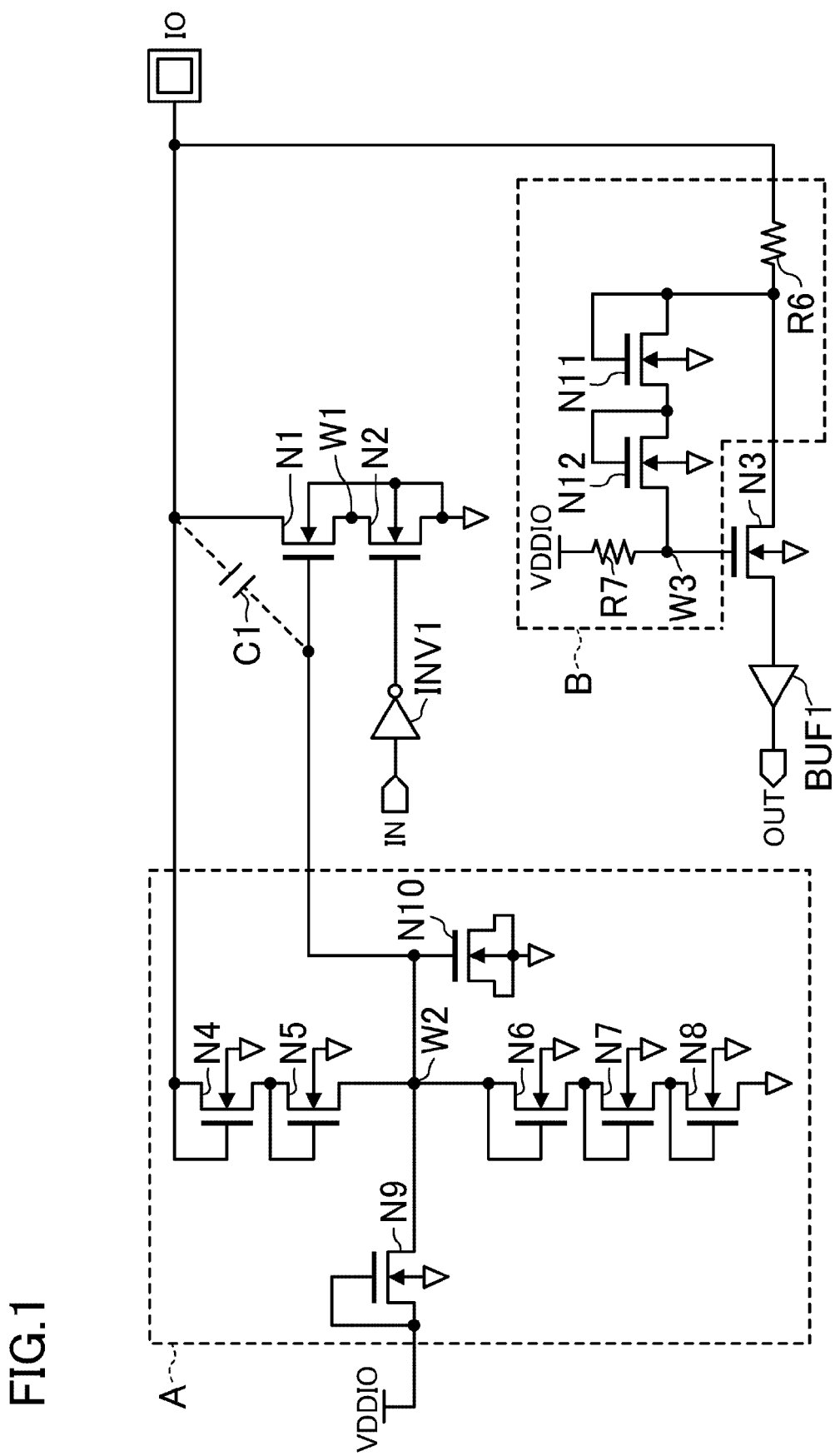
FIG. 1 is a diagram showing an input/output circuit according to a first embodiment of the present disclosure.

FIG. 1 is a diagram showing a specific configuration of an input/output circuit according to a first embodiment. The input/output circuit of FIG. 1 includes an output circuit which includes two N-channel MOS transistors (hereinafter referred to as NMOS transistors) N1 and N2 and an inverter INV1, an input circuit which includes an NMOS transistor N3 and an input buffer BUF1, an input terminal IN, an input/output terminal (external connection pad) IO, an output terminal OUT, an output transistor bias generation circuit A, and an input transistor bias generation circuit B. A signal input through the input terminal IN is output to an external signal line (not shown in FIG. 1) of an LSI circuit connected to the input/output terminal IO, and is transmitted to circuitry outside the LSI circuit. Alternatively, a signal input through the external signal line of the LSI circuit connected to the input/output terminal IO is transmitted through the output terminal OUT to circuitry inside the LSI circuit.

The output circuit includes the NMOS transistors N1 and N2 connected in series between the input/output terminal IO and a ground line GND, and the inverter INV1 which controls the output state. The drain of the NMOS transistor N1 is connected to the input/output terminal IO, and the source of the NMOS transistor N2 is connected to the ground line GND. In this case, a connection point of the NMOS transistors N1 and N2 is referred to as a middle node W1. The output transistor bias generation circuit A is connected to the gate of the NMOS transistor N1, and the input terminal IN is connected via the inverter INV1 to the gate of the NMOS transistor N2.

The input circuit includes the input buffer BUF1 which receives a signal input through the input/output terminal IO, and the NMOS transistor N3 whose drain is connected to the input/output terminal IO and whose source is connected to an input portion of the input buffer BUF1. The input transistor bias generation circuit B is connected to the gate of the NMOS transistor N3.

The output transistor bias generation circuit A includes six diode-connected NMOS transistors N4, N5, N6, N7, N8, and N9, and a single capacitor-connected NMOS transistor N10. Specifically, the drain and gate of the NMOS transistor N4 are connected to the input/output terminal IO, and the source of the NMOS transistor N4 is connected to the drain of the NMOS transistor N5. The drain and gate of the NMOS transistor N5 are connected to the source of the NMOS transistor N4, and the source of the NMOS transistor N5 is connected to the gate of the NMOS transistor N1. The drain and gate of the NMOS transistor N6 are connected to the source of the NMOS transistor N5 (the same node as that of the gate of the NMOS transistor N1, which is referred to as a middle node W2), and the source of the NMOS transistor N6 is connected to the drain of the NMOS transistor N7. The drain and gate of the NMOS transistor N7 are connected to the source of the NMOS transistor N6, and the source of the NMOS transistor N7 is connected to the drain of the NMOS transistor N8. The drain and gate of the NMOS transistor N8 are connected to the source of the NMOS transistor N7, and the source of the NMOS transistor N8 is connected to the ground line GND. The drain and gate of the NMOS transistor N9 are connected to a high power supply voltage VDDIO of the LSI circuit, and the source of the NMOS transistor N9 is connected to the middle node W2. The gate of the NMOS transistor N10 is connected to the middle node W2, and the drain and source of the NMOS transistor N10 are connected to the ground line GND. In this case, the NMOS transistors N4-N9 have electrical characteristics equivalent to those of a diode, and the NMOS transistor N10 has electrical characteristics equivalent to those of a capacitor.

The input transistor bias generation circuit B includes two diode-connected NMOS transistors N11 and N12 and two resistors R6 and R7. Specifically, one end of the resistor R6 is connected to the input/output terminal IO, and the other end of the resistor R6 is connected to the drain of the NMOS transistor N3. The drain and gate of the NMOS transistor N11 are connected to the drain of the NMOS transistor N3, and the source of the NMOS transistor N11 is connected to the drain of the NMOS transistor N12. The drain and gate of the NMOS transistor N12 are connected to the source of the NMOS transistor N11, and the source of the NMOS transistor N12 is connected to the gate of the NMOS transistor N3. One end of the resistor R7 is connected to the high power supply voltage VDDIO, and the other end of the resistor R7 is connected to the gate of the NMOS transistor N3. In this case, the gate of the NMOS transistor N3 is referred to as a middle node W3. Note that the NMOS transistors N11 and N12 have electrical characteristics equivalent to those of a diode.

Operation of the input/output circuit thus configured will be described hereinafter. Here, it is assumed that the LSI circuit includes two power supplies, the high power supply voltage VDDIO is 3.3 V, a low power supply voltage VDD is 1.2 V, and the voltage of the external signal line is 5 V. Operation where the voltage of the external signal line is 3.3 V is similar to that which will be described hereinafter, except for the voltage amplitude, and therefore, will not be described.

Firstly, operation where a signal input through the input terminal IN is output to the external signal line of the LSI circuit connected to the input/output terminal IO and is transmitted to circuitry outside the LSI circuit, will be described. When the signal input to the input terminal IN is at the low level (0 V), the inverter INV1 inverts the signal, so that the gate of the NMOS transistor N2 is at 3.3 V. The middle node W2 in the output transistor bias generation circuit A has a voltage which is obtained by dividing the high power supply voltage VDDIO (=3.3 V) of the LSI circuit using the NMOS transistors N9, N6, N7, and N8 (if the NMOS transistors N9, N6, N7, and N8 have the same gate length and gate width, the voltage obtained by voltage division=3.3 V×(¾)=2.5 V), and therefore, a voltage sufficient to turn the NMOS transistor N1 on is supplied to the gate of the NMOS transistor N1. As a result, both of the NMOS transistors N1 and N2 are turned on, so that the low voltage (0 V) is output to the input/output terminal IO.

When the signal input to the input terminal IN transitions from the low level (0 V) to the high level (1.2 V) (actually, a level shift circuit which converts a signal having an amplitude of 1.2 V into a signal having an amplitude of 3.3 V is provided between the input terminal IN and the inverter INV1, but is not shown in FIG. 1), the inverter INV1 inverts the signal, so that the gate of the NMOS transistor N2 transitions to 0 V, and therefore, the NMOS transistor N2 is turned off, and the input/output terminal IO transitions to a high impedance state. The input/output terminal IO is gradually pulled up to 5 V by an external pull-up resistor and eventually transitions to 5 V. In this case, when the signal is transitioned, the voltage of the middle node W2 in the output transistor bias generation circuit A (the gate voltage of the NMOS transistor N1) is maintained at the voltage (=2.5 V) obtained by voltage division with the NMOS transistors N9, N6, N7, and N8 until the voltage of the input/output terminal IO reaches a predetermined voltage ("the threshold voltage of the NMOS transistors N4 and N5 connected together in series"+"the voltage of the middle node W2 obtained by voltage division with the NMOS transistors N9, N6, N7, and N8"). When the voltage of the input/output terminal IO exceeds the threshold voltage of the NMOS transistors N4 and N5 connected together in series, the voltage of the middle node W2 in the output transistor bias generation circuit A transitions to a voltage obtained by dividing the voltage of the input/output terminal IO using the NMOS transistors N4, N5, N6, N7, and N8 (finally, if the NMOS transistors N4, N5, N6, N7, and N8 have the same gate length and gate width, the voltage obtained by voltage division=5 V×(⅗)=3 V, where IO=5 V). When the signal input to the input terminal IN is at the high level (1.2 V), the signal input to the input terminal IN is in the final state which is reached by transition from the low level (0 V) to the high level (1.2 V). When the signal input to the input terminal IN transitions from the high level (1.2 V) to the low level (0 V), the operation where the signal input to the input terminal IN transitions from the low level (0 V) to the high level (1.2 V) is reversed, so that the signal input to the input terminal IN finally transitions to the low level (0 V).

Thus, the signal input through the input terminal IN can be output to the external signal line of the LSI circuit connected to the input/output terminal IO and transmitted to circuitry outside the LSI circuit.

Next, operation where the signal input through the external signal line of the LSI circuit connected to the input/output terminal IO is transmitted through the output terminal OUT to circuitry inside the LSI circuit. When the signal input to the input/output terminal IO is at the low level (0 V), the voltage of the middle node W3 (the gate voltage of the NMOS transistor N3) in the input transistor bias generation circuit B is the high power supply voltage VDDIO (=3.3 V) of the LSI circuit, and the NMOS transistor N3 is turned on. As a result, the input voltage of the input buffer BUF1 is 0 V, and the output terminal OUT is at the low level (0 V).

When the signal input to the input/output terminal IO transitions from the low level (0 V) to the high level (5 V) (actually, a level shift circuit which converts a signal having an amplitude of 3.3 V into a signal having an amplitude of 1.2 V is provided between the input buffer BUF1 and the output terminal OUT, but is not shown in FIG. 1), the voltage of the middle node W3 in the input transistor bias generation circuit B is maintained at the high power supply voltage VDDIO (=3.3 V) of the LSI circuit until the voltage of the input/output terminal IO reaches a predetermined voltage ("the threshold voltage of the NMOS transistors N11 and N12 connected together in series"+"the high power supply voltage VDDIO (=3.3 V) of the LSI circuit"). When the voltage of the middle node W3 in the input transistor bias generation circuit B exceeds the predetermined voltage, the voltage of the middle node W3 in the input transistor bias generation circuit B transitions to a voltage obtained by dividing the voltage of the input/output terminal IO using the NMOS transistors N11 and N12 and the resistor R7. Note that, in this input/output circuit, the threshold voltages of the NMOS transistors N11 and N12 connected together in series are set to be higher than a predetermined voltage ("the voltage of the input/output terminal IO"−"the high power supply voltage VDDIO (=3.3 V) of the LSI circuit") in order to ensure the reliability of the gate oxide film, and therefore, the voltage of the middle node W3 in the input transistor bias generation circuit B is the high power supply voltage VDDIO (=3.3 V) of the LSI circuit. As a result, the NMOS transistor N3 is turned off, and the input voltage of the input buffer BUF1 transitions to a predetermined voltage ("the high power supply voltage VDDIO (=3.3 V) of the LSI circuit"−"the threshold voltage of the NMOS transistor N3"), and the output terminal OUT transitions to the high level (1.2 V). When the signal input to the input/output terminal IO is at the high level (5 V), the signal input to the input/output terminal IO is in the final state which is reached by transition from the low level (0 V) to the high level (5 V), so that the output terminal OUT transitions to the high level (1.2 V). When the signal input to the input/output terminal IO transitions from the high level (5 V) to the low level (0 V), the operation where the signal input to the input/output terminal IO transitions from the low level (0 V) to the high level (5 V) is reversed, so that the signal input to the input/output terminal IO finally transitions to the low level (0 V).

Thus, the signal input through the external signal line connected to the input/output terminal IO can be transmitted through the output terminal OUT to circuitry inside the LSI circuit.

Next, the reliability (TDDB reliability) of the gate oxide film of the input/output circuit of FIG. 1 will be described with reference to FIGS. 2-4.

Figure 2:
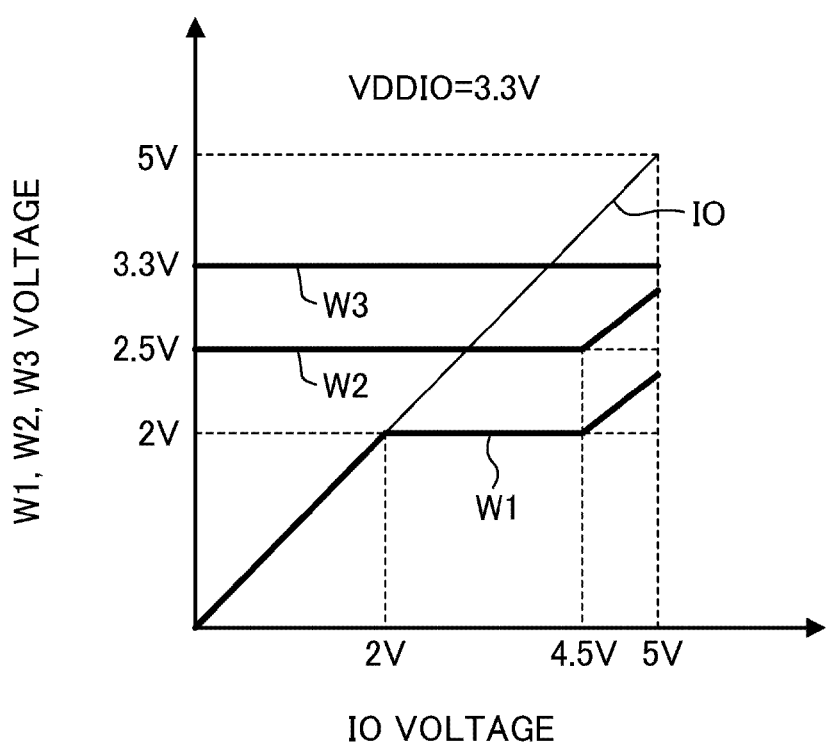
FIG. 2 is a diagram for describing the voltages of internal input nodes during DC operation where a power supply voltage of 3.3 V is applied to the input/output circuit of FIG. 1.
Figure 3:
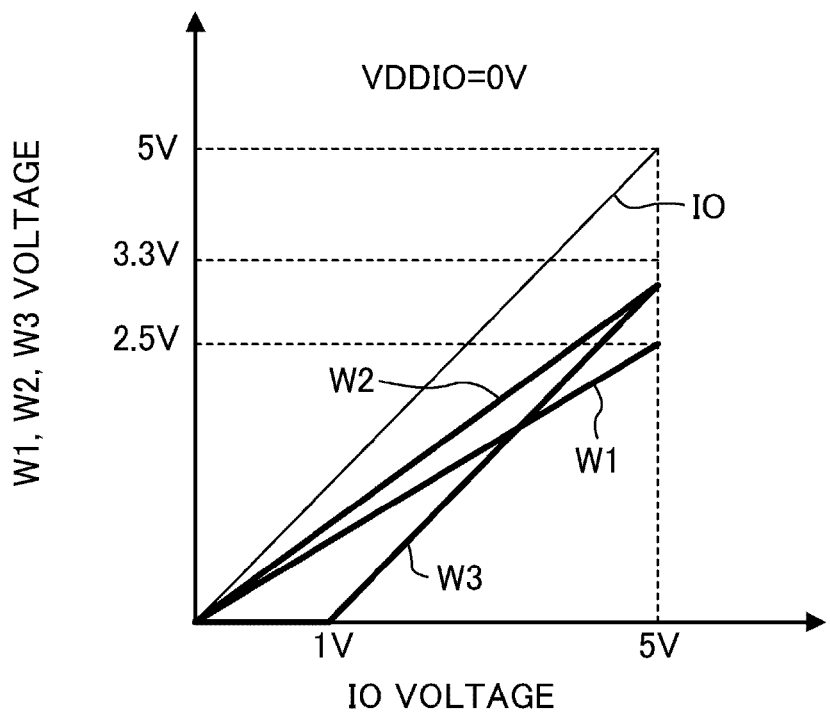
FIG. 3 is a diagram for describing the voltages of the internal input nodes during DC operation where a power supply voltage line is off in the input/output circuit of FIG. 1.

FIGS. 2 and 3 show voltages of the middle nodes W1, W2, and W3 which are obtained when a voltage of 0-5 V is input to the input/output terminal IO. FIG. 2 shows voltages of the middle nodes W1, W2, and W3 which are obtained when the high power supply voltage VDDIO of the LSI circuit is 3.3 V. FIG. 3 shows voltages of the middle nodes W1, W2, and W3 which are obtained when the high power supply voltage VDDIO of the LSI circuit is 0 V (the high voltage power supply of the LSI circuit is off).

As shown in FIG. 2, when VDDIO=3.3 V, the voltage of the middle node W2 ranges from about 2.5 V to 3.3 V due to the output transistor bias generation circuit A, because the voltage of the input/output terminal IO is 0-5 V and the high power supply voltage VDDIO of the LSI is 3.3 V, as described above with respect to the operation. The voltage of the middle node W1 is equal to the voltage of the input/output terminal IO when the voltage of the input/output terminal IO is within the range from zero to a predetermined voltage ("the voltage of the middle node W2"−"the threshold voltage of the NMOS transistor N1"), because the NMOS transistor N1 is on. When the voltage of the input/output terminal IO exceeds the predetermined voltage, the NMOS transistor N1 is off, and therefore, the voltage of the middle node W1 is "the voltage of the middle node W2"−"the threshold voltage of the NMOS transistor N1." When the voltage of the input/output terminal IO is 0-5 V, the input transistor bias generation circuit B causes the voltage of the middle node W3 to be equal to the high power supply voltage VDDIO (=3.3 V) of the LSI circuit, as described above with respect to the operation. Therefore, when VDDIO=3.3 V, the input/output circuit of FIG. 1 allows all of the gate-drain voltages, gate-source voltages, and drain-source voltages of the NMOS transistors N1, N2, and N3 to be lower than or equal to the high power supply voltage VDDIO of the LSI circuit, whereby the reliability can be ensured.

As shown in FIG. 3, when VDDIO=0 V, the output transistor bias generation circuit A causes the voltage of the middle node W2 to be equal to a voltage obtained by dividing the voltage of the input/output terminal IO using the NMOS transistors N4, N5, N6, N7, and N8 (the voltage obtained by voltage division=5 V×(3/5)=3V, where the NMOS transistors N4, N5, N6, N7, and N8 all have the same gate length and gate width, and IO=5 V). The voltage of the middle node W1 is "the voltage of the middle node W2"−"the threshold voltage of the NMOS transistor N1" because the NMOS transistor N1 is off. The voltage of the middle node W3 is 0 V when the voltage of the input/output terminal IO is lower than the threshold voltage of the NMOS transistors N11 and N12 connected together in series, and is equal to a voltage obtained by dividing the voltage of the input/output terminal IO using the NMOS transistors N11 and N12 and the resistor R7 when the voltage of the input/output terminal IO is higher than or equal to the threshold voltage of the NMOS transistors N11 and N12 connected together in series. The resistance of the resistor R7 is set so that when the voltage of the input/output terminal IO is 5 V and VDDIO=3.3 V, the voltage of the middle node W3 is almost the same as the high power supply voltage VDDIO of the LSI circuit. Therefore, when VDDIO=0 V, the input/output circuit of FIG. 1 allows all of the gate-drain voltages, gate-source voltages, and drain-source voltages of the NMOS transistors N1, N2, and N3 to be lower than the high power supply voltage VDDIO of the LSI circuit, whereby the reliability can be ensured.

Figure 4:
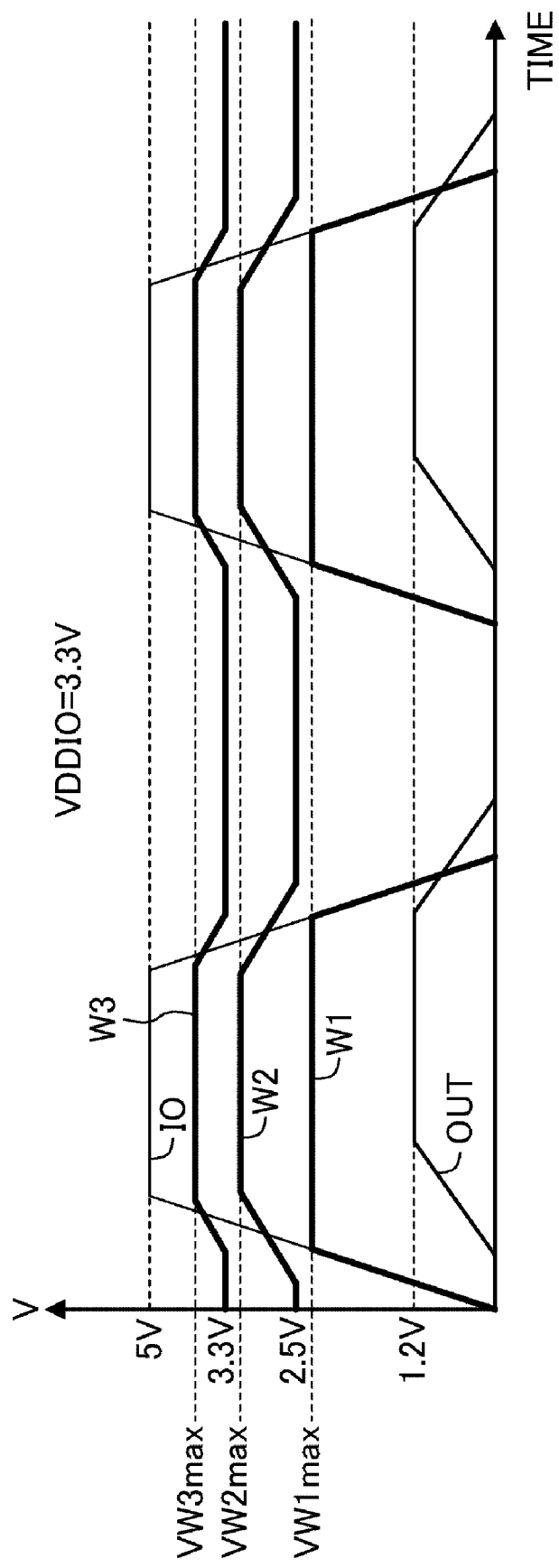
FIG. 4 is a diagram for describing the voltages of the internal input nodes during AC operation of the input/output circuit of FIG. 1.

FIG. 4 is a diagram showing the voltages of the middle nodes W1, W2, and W3 and the output terminal OUT which are obtained when a signal having a specific frequency is input to the input/output terminal IO. A pulse waveform having an amplitude of 5 V is input to the input/output terminal IO, and a waveform having an amplitude of 1.2 V is output from the output terminal OUT. Note that a level shift circuit which converts a signal having an amplitude of 3.3 V into a signal having an amplitude of 1.2 V is provided between the input buffer BUF1 and the output terminal OUT, but is not shown in FIG. 1. A problem arises with the reliability only during a half period in which the input/output terminal IO transitions from the low level (0 V) to the high level (5 V) and is maintained at the high level. Therefore, only this period will be described below.

When the input/output terminal IO transitions from the low level (0 V) to the high level (5 V), a parasitic coupling capacitance C1 between the input/output terminal IO and the gate of the NMOS transistor N1 raises the voltage of the middle node W2 (the gate voltage of the NMOS transistor N1) from the voltage (the voltage obtained by voltage division=5 V×(⅗)=3 V when IO=5 V) described above with respect of the operation. The raised voltage is maintained while the input/output terminal IO is at the high level, because the gate of the NMOS transistor N1 is cut off from the high power supply voltage VDDIO of the LSI circuit by the NMOS transistor N9, and the NMOS transistor N1 (output transistor) has a large gate width and therefore the parasitic capacitance C1 is large. Therefore, by adding the NMOS transistor N10 (equivalent to a capacitive element between the NMOS transistor N1 and the ground line GND), the raised voltage of the middle node W2 can be reduced. The capacitance value is adjusted by adjusting the gate length and gate width of the NMOS transistor N10 so that all of the gate-drain voltages, gate-source voltages, and drain-source voltages of the NMOS transistors N1 and N2 are lower than the high power supply voltage VDDIO of the LSI circuit. During the time that the input/output terminal IO is at the high level, the voltage of the middle node W1 is lower than the voltage of the middle node W2 by the threshold voltage of the NMOS transistor N1. When the input/output terminal IO transitions from the low level (0 V) to the high level (5 V), the voltage of the middle node W3 is raised from the high power supply voltage VDDIO (=3.3 V) of the LSI circuit due to a parasitic coupling capacitance between the input/output terminal IO and the gate of the NMOS transistor N3. In this case, the gate width of the NMOS transistor N3 is adjusted so that all of the gate-drain voltage, gate-source voltage, and drain-source voltage of the NMOS transistor N3 are lower than or equal to the high power supply voltage VDDIO of the LSI circuit. If the gate width of the NMOS transistor N3 is excessively large, the gate voltage of the NMOS transistor N3 is excessively raised, so that the input voltage of the input buffer BUF1 exceeds the high power supply voltage VDDIO (=3.3 V) of the LSI circuit, and therefore, a problem may arise with the reliability of the gate oxide film of the input buffer BUF1. Therefore, the gate width of the NMOS transistor N3 needs to be small, preferably 1 µm or less. Note that the input voltage of the input buffer BUF1 is lower than the voltage of the middle node W3 by the threshold voltage of the NMOS transistor N3. Therefore, even when a signal having a specific frequency is input to the input/output terminal IO, the input/output circuit of FIG. 1 allows all of the gate-drain voltages, gate-source voltages, and drain-source voltages of the NMOS transistors N1, N2, and N3 to be lower than or equal to the high power supply voltage VDDIO of the LSI circuit, whereby the reliability can be ensured.

<<Second Embodiment>>

Figure 5:
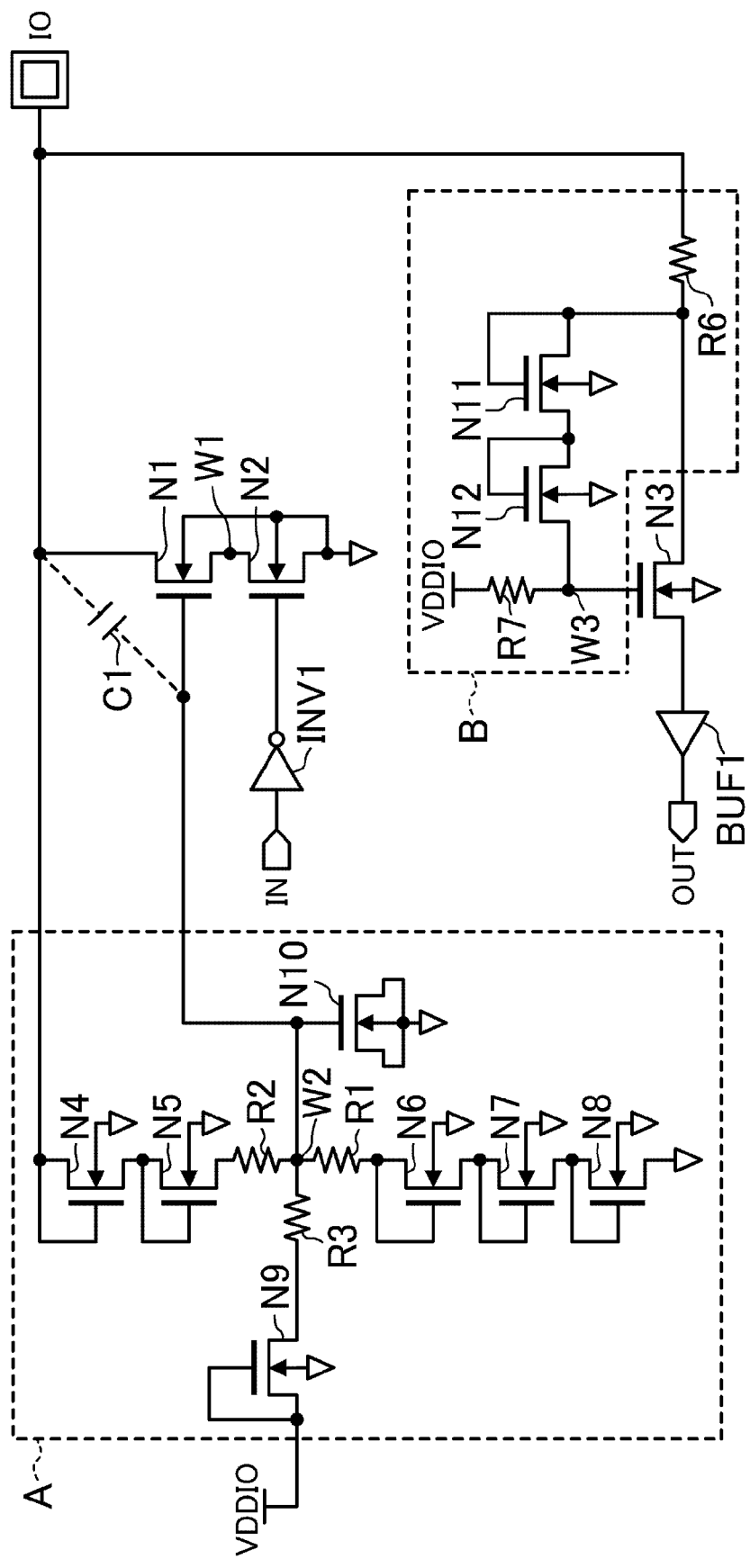
FIG. 5 is a diagram showing an input/output circuit according to a second embodiment of the present disclosure.

FIG. 5 is a diagram showing a specific configuration of an input/output circuit according to a second embodiment. The input/output circuit of FIG. 5 is similar to that of FIG. 1, except that a resistor R1 is provided between the NMOS transistor N6 and the middle node W2, a resistor R2 is provided between the NMOS transistor N5 and the middle node W2, and a resistor R3 is provided between the NMOS transistor N9 and the middle node W2. In the output transistor bias generation circuit A of FIG. 1, the NMOS transistors N4, N5, N6, N7, N8, and N9 each have a connection which provides electrical characteristics equivalent to those of a diode. Therefore, a current invariably flows from the input/output terminal IO to the ground line GND, and a current invariably flows from the high power supply voltage VDDIO of the LSI circuit to the ground line GND, so that the power consumption of the LSI circuit is increased. The resistors R1, R2, and R3 are used to reduce these currents, whereby the power consumption of the LSI circuit can be reduced. The resistors R1, R2, and R3 may be formed of polysilicon.

The only difference from the input/output circuit of FIG. 1 is the voltage of the middle node W2 in the output transistor bias generation circuit A. When the signal input to the input terminal IN is at the low level (0 V), the middle node W2 has a voltage which is obtained by dividing the high power supply voltage VDDIO (=3.3 V) of the LSI circuit using the NMOS transistor N9, the resistors R3 and R1, and the NMOS transistors N6, N7, and N8. The voltage of the middle node W2 is different from that in the input/output circuit of FIG. 1, but by adjusting the gate length and gate width of the NMOS transistor N10 to adjust the capacitance value, the reliability of the gate oxide film FIG. 5 can be ensured when a signal having a specific frequency is input to the input/output terminal IO, as in the input/output circuit of the first embodiment.

According to this embodiment, the resistors R1, R2, and R3 are provided between the middle node W2, and the input/output terminal IO, the ground line GND, and the high power supply voltage VDDIO of the LSI circuit, respectively. Therefore, if the resistors R1, R2, and R3 have the same width and length, the voltage of the middle node W2 does not change even when there are variations in process conditions, advantageously resulting in high resistance to the variations. Note that even if any one or two of the three resistors R1, R2, and R3 are removed, the power consumption reducing effect is obtained.

<<Third Embodiment>>

Figure 6:
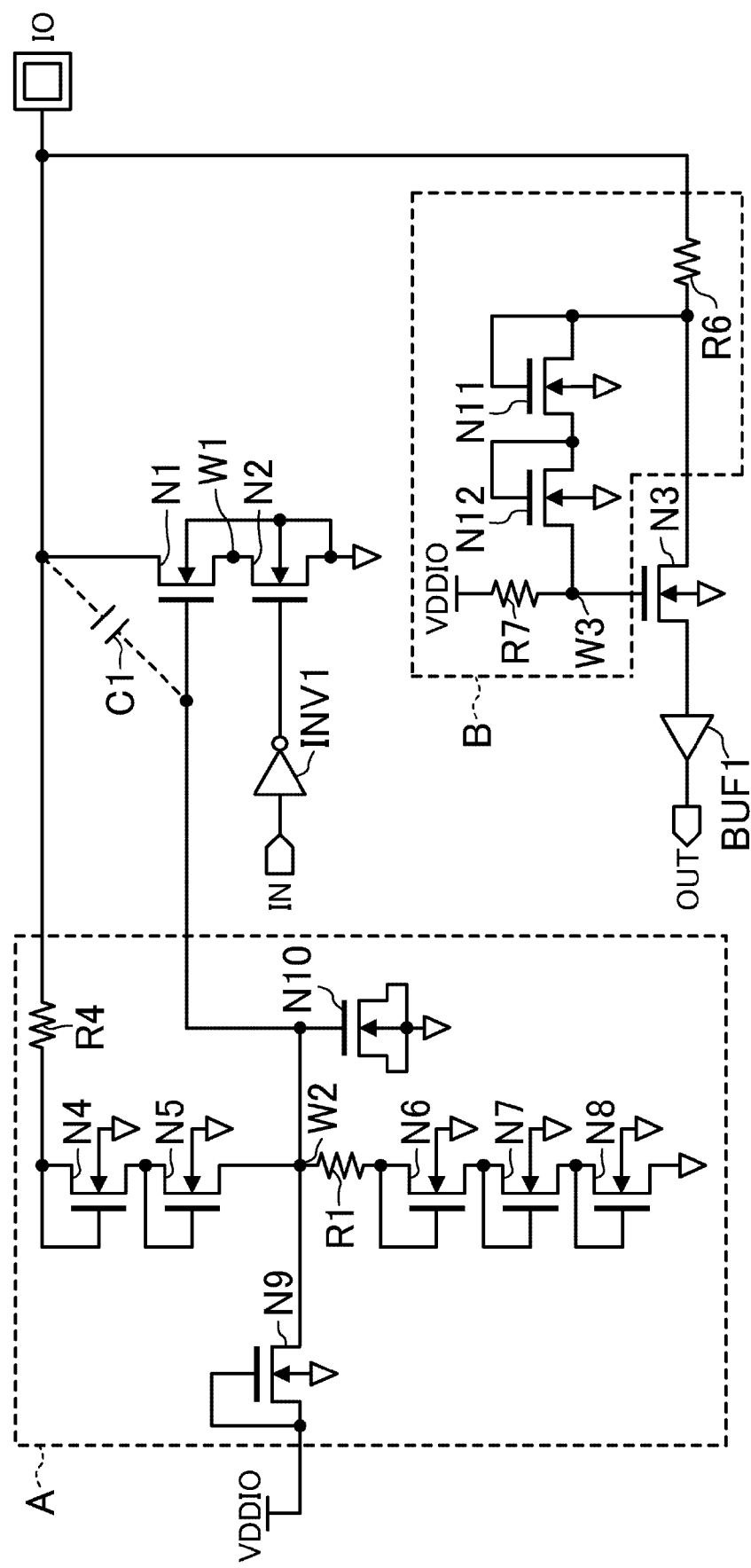
FIG. 6 is a diagram showing an input/output circuit according to a third embodiment of the present disclosure.

FIG. 6 is a diagram showing a specific configuration of an input/output circuit according to a third embodiment. The input/output circuit of FIG. 6 is similar to that of FIG. 1, except that a resistor R1 is provided between the NMOS transistor N6 and the middle node W2, and a resistor R4 is provided between the input/output terminal IO and the NMOS transistor N4. By providing the resistor R4, a surge current which flows through the NMOS transistor N4 when a surge voltage is applied through the input/output terminal IO can be reduced, thereby reducing or preventing damage to the transistor caused by the application of the surge voltage.

In the above embodiments, an example in which an electrostatic discharge (ESD) protective circuit is not provided has been described. If an ESD protective circuit is provided, then when the gate voltages of the NMOS transistors N1 and N2 in the presence of the applied surge voltage is different from the gate voltage of the ESD protective transistor in the presence of the applied surge voltage, the breakdown voltages of these transistors differ from each other, and therefore, the output transistor and the ESD protective transistor cannot uniformly operate in the presence of the applied surge voltage. In this case, the surge current may be concentrated into the output transistor, so that the output transistor may be damaged. In FIG. 1, the NMOS transistors N1 and N2 (output transistors) function as an ESD protective transistor to accommodate the surge. However, the gate widths of the NMOS transistors N1 and N2 alone are not sufficient to provide the function of an ESD protective transistor. Therefore, a gate width sufficient to provide the function of an ESD protective transistor may be added to a transistor which fixes the input terminal IN connected to the NMOS transistor N2 to the high level in the LSI circuit.

An ESD protective circuit may be provided in each of the above embodiments. In this case, it is no longer necessary to add a transistor which fixes the input terminal IN to the high level in the LSI circuit to add a gate width, and therefore, the cell area can be reduced.

In the output transistor bias generation circuit A of FIG. 1, two NMOS transistors are provided between the input/output terminal IO and the middle node W2, three NMOS transistors are provided between the middle node W2 and the ground line GND, and one NMOS transistor is provided between the high power supply voltage VDDIO of the LSI circuit and the middle node W2. Alternatively, any number of NMOS transistors together connected in series may be provided if all of the gate-drain voltages, gate-source voltages, and drain-source voltages of the NMOS transistors N1 and N2 can be set to be lower than or equal to the high power supply voltage VDDIO of the LSI circuit. Similarly, in the input transistor bias generation circuit B, two NMOS transistors are provided between the input/output terminal IO and the middle node W3. Alternatively, any number of NMOS transistors together connected in series may be provided if all of the gate-drain voltage, gate-source voltage, and drain-source voltage of the NMOS transistor N3 can be set to be lower than or equal to the high power supply voltage VDDIO of the LSI circuit.

<<Fourth Embodiment>>

Figure 7:
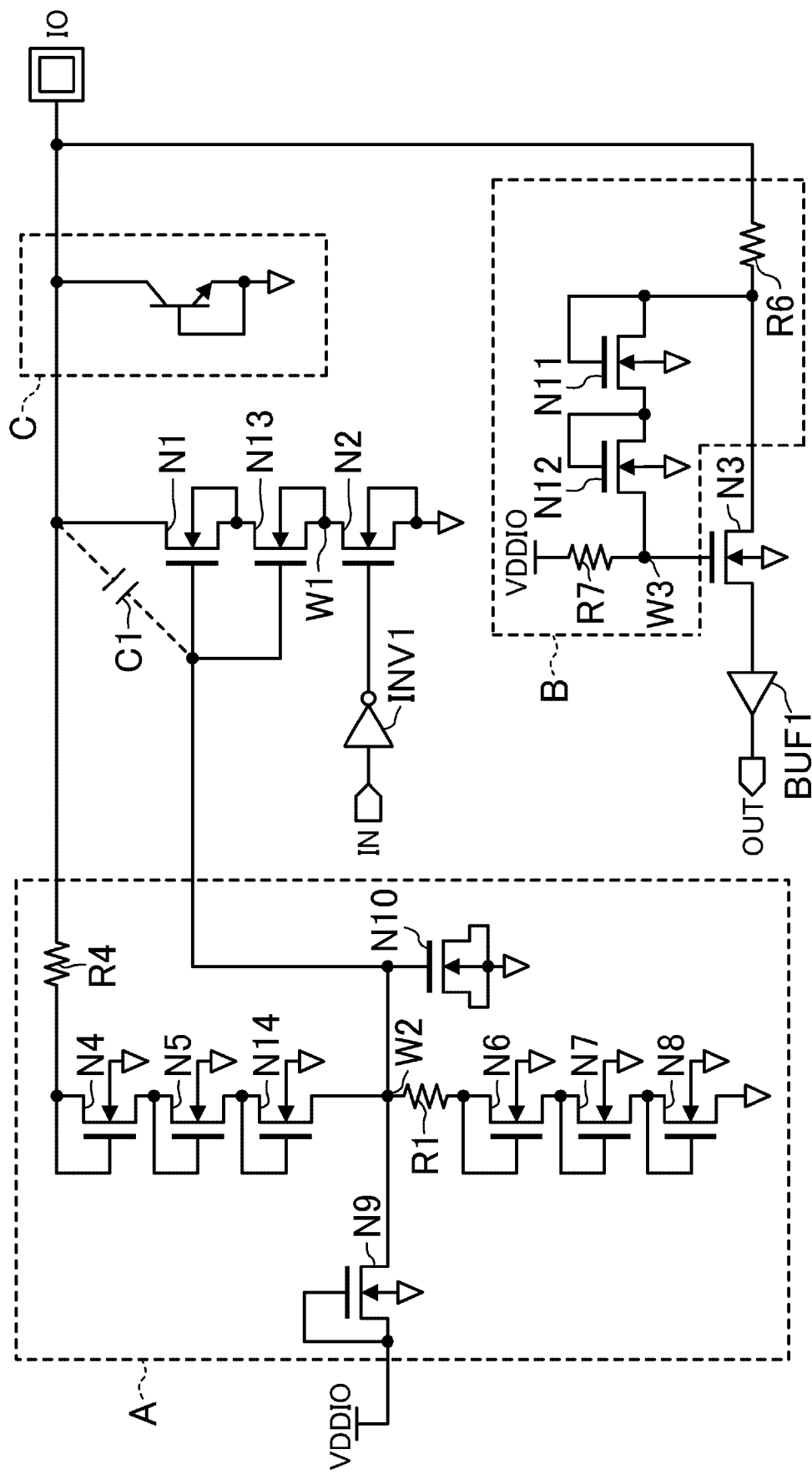
FIG. 7 is a diagram showing an input/output circuit according to a fourth embodiment of the present disclosure.

FIG. 7 is a diagram showing a specific configuration of an input/output circuit according to a fourth embodiment. The input/output circuit of FIG. 7 is similar to that of FIG. 6, except that an NMOS transistor N13 is provided between the NMOS transistor N1 and the NMOS transistor N2, an NMOS transistor N14 is provided between the NMOS transistor N5 and the middle node W2, an ESD protective circuit C including a bipolar transistor is provided between the input/output terminal IO and the ground line GND, and the back gate of the NMOS transistor N1 is connected to the well instead of the ground line GND. The NMOS transistor N13 is connected in series between the NMOS transistor N1 and the NMOS transistor N2, the gate of the NMOS transistor N13 is connected to the middle node W2, and the back gate of the NMOS transistor N13 is connected to the well. The drain and gate of the NMOS transistor N14 are connected to the source of the NMOS transistor N5, and the source of the NMOS transistor N14 is connected to the gate of the NMOS transistor N1.

In the first to third embodiments, when the input/output terminal IO transitions from the low level (0 V) to the high level (5 V), the voltage of the middle node W2 (the gate voltage of the NMOS transistor N1) is raised due to the parasitic coupling capacitance C1 between the input/output terminal IO and the gate of the NMOS transistor N1. In this embodiment, the back gates of the NMOS transistors N1 and N13 are connected to the well, and therefore, the wells and sources of the NMOS transistors N1 and N13 are also raised at the same time when the middle node W2 is raised. Therefore, it is no longer necessary to set the voltage of the middle node W2 to a high value compared to the first to third embodiments, and therefore, the NMOS transistor N14 can be added. By adding the NMOS transistor N14, the voltage of the middle node W2 is reduced, whereby the capacitance of the NMOS transistor N10 for reducing the raised voltage of the middle node W2 can be reduced, and therefore, the cell area can be reduced.

In this embodiment, the NMOS transistors N1 and N13 in which the back gate is connected to the source are used as an output circuit, and therefore, the output transistor does not function as an ESD protective transistor. Therefore, an ESD protective circuit C needs to be additionally provided.

Although, in FIG. 7, a bipolar transistor is used as an example of the ESD protective circuit C, the present disclosure is not limited to this. For example, a MOS transistor or a thyristor circuit may be used.

<<Fifth Embodiment>>

Figure 8:
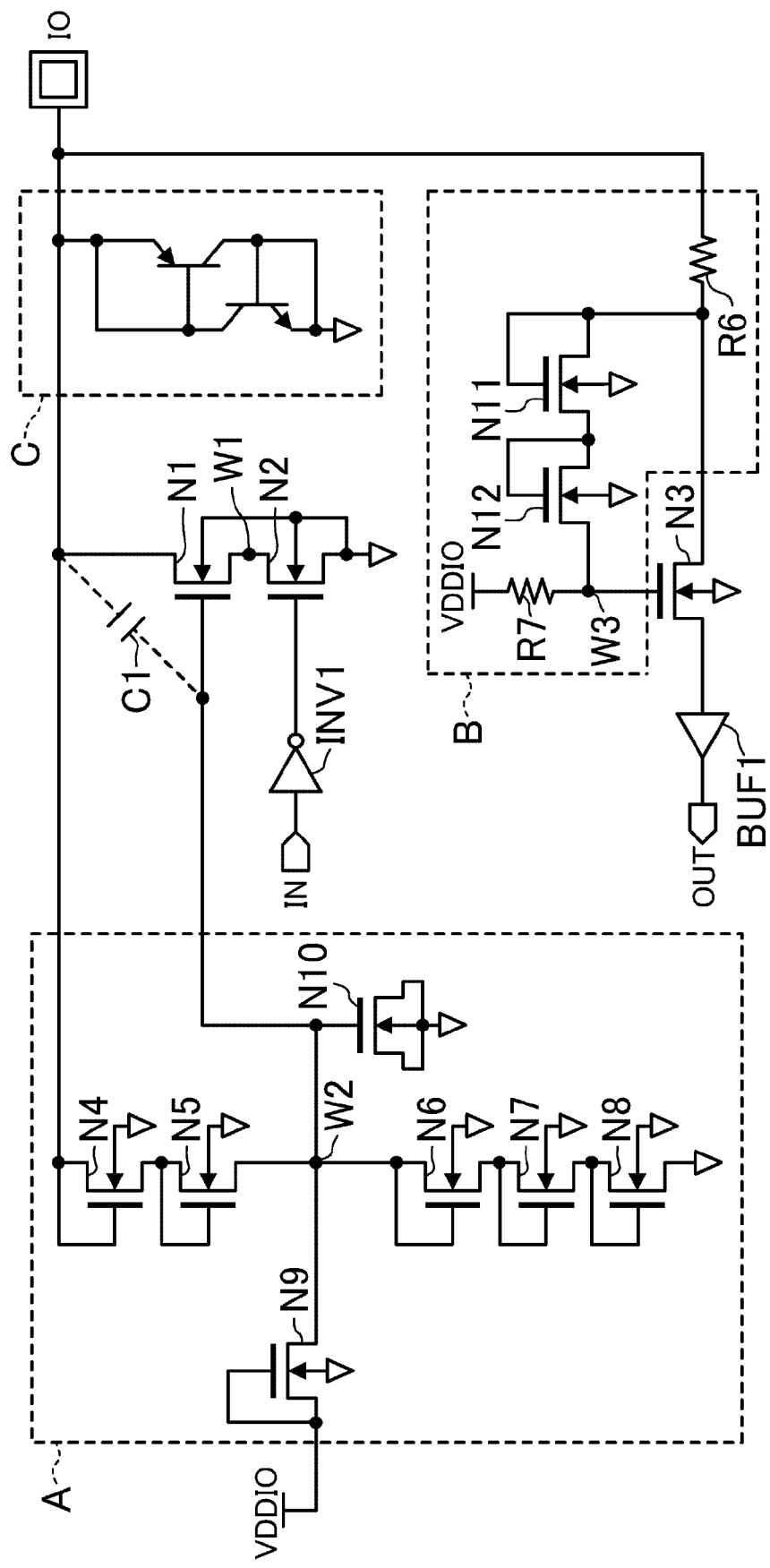
FIG. 8 is a diagram showing an input/output circuit according to a fifth embodiment of the present disclosure.

FIG. 8 is a diagram showing a specific configuration of an input/output circuit of a fifth embodiment. The input/output circuit of FIG. 8 is similar to that of FIG. 1, except that an ESD protective circuit C including a thyristor circuit is provided between the input/output terminal IO and the ground line GND.

In the first embodiment, by adding a gate width sufficient to provide the function of an ESD protective transistor in a transistor for fixing the input terminal IN connected to the NMOS transistor N2 to the high level in the LSI circuit, the NMOS transistors N1 and N2 (output transistors) are used as an ESD protective circuit. In this embodiment, the ESD protective circuit C including a thyristor circuit is used instead of adding a transistor gate width. By using the thyristor circuit, the surge current can be reduced, and damage to the transistor due to the surge voltage from the input/output terminal IO can be reduced or prevented, as in the first embodiment.

Also, as in this embodiment, by providing the thyristor circuit instead of adding a gate width, the cell area can be reduced.

Note that, in each of the above embodiments, the NMOS transistors N4, N5, N6, N7, N8, N9, and N14 may be any element having electrical characteristics of a diode, and therefore, may be replaced with a P-channel MOS transistor having a connection which provides electrical characteristics of a diode (the drain and well are connected together, or the source and gate are connected together). Instead of transistors, a diode including a P+ diffusion layer and an N+ diffusion layer may be used.

If the NMOS transistors N4, N5, N6, N7, N8, and N14 have the same gate length and gate width, the voltage of the middle node W2 does not change even when there are variations in process conditions, advantageously resulting in high resistance to the variations. Similarly, if the NMOS transistors N6, N7, N8, and N9 have the same gate length and gate width, high resistance to the variations is provided. Even if P-channel MOS transistors or diodes are used, then when the P-channel MOS transistors or diodes have the same gate length and gate width, a similar advantage can be obtained.

The present disclosure is useful for an input/output circuit which is connected to an external signal line (e.g., an I2C bus) having a voltage higher than the power supply voltage of an LSI circuit.

What is claimed is:

1. An input/output circuit for an LSI circuit having an external connection pad, comprising:
   an input circuit connected to the external connection pad; and
   an output circuit connected to the external connection pad, wherein the output circuit includes
  a first and a second N-channel MOS transistor provided between the external connection pad and a ground line of the LSI circuit, and connected together in series, where the first N-channel MOS transistor is closer to the external connection pad and the second N-channel MOS transistor is closer to the ground line, and
  an output transistor bias generation circuit configured to supply, to the gate of the first N-channel MOS transistor, a voltage which is determined by a voltage of the external connection pad and a voltage of a power supply line of the LSI circuit, and
the output transistor bias generation circuit includes
  a first diode element provided between the external connection pad and the gate of the first N-channel MOS transistor,
  a second diode element provided between the gate of the first N-channel MOS transistor and the ground line,
  a third diode element provided between the power supply line and the gate of the first N-channel MOS transistor, and
  a capacitive element provided between the gate of the first N-channel MOS transistor and the ground line.

2. The input/output circuit of claim 1, wherein
the first diode element includes two diode-connected MOS transistors connected together in series,
the second diode element includes three diode-connected MOS transistors connected together in series, and
the third diode element includes one diode-connected MOS transistor.

3. The input/output circuit of claim 2, wherein
the MOS transistors included in the first, second, and third diode elements all have the same gate length and gate width.

4. The input/output circuit of claim 1, wherein
the capacitive element is a MOS transistor whose gate is connected to the gate of the first N-channel MOS transistor and whose drain and source are connected to the ground line.

5. The input/output circuit of claim 1, wherein
the output transistor bias generation circuit further includes a resistive element provided between at least one of the first, second and third diode elements and the gate of the first N-channel MOS transistor.

6. The input/output circuit of claim 1, wherein
the output transistor bias generation circuit further includes a resistive element provided between the external connection pad and the first diode element.

7. The input/output circuit of claim 1, wherein
the output circuit further includes an input terminal connected to the gate of the second N-channel MOS transistor, and
a ground potential is output to the external connection pad by the second N-channel MOS transistor, depending on a state of the input terminal.

8. The input/output circuit of claim 1, wherein
the input circuit includes
  a third N-channel MOS transistor whose drain is connected to the external connection pad,
  an input buffer whose input terminal is connected to the source of the third N-channel MOS transistor, and
  an input transistor bias generation circuit configured to supply, to the gate of the third N-channel MOS transistor, a voltage which is determined based on the voltage of the external connection pad and the voltage of the power supply line.

9. The input/output circuit of claim 8, wherein
the input transistor bias generation circuit includes
  a first resistive element provided between the external connection pad and the drain of the third N-channel MOS transistor,
  a fourth diode element between the drain of the third N-channel MOS transistor and the gate of the third N-channel MOS transistor, and
  a second resistive element provided between the power supply line and the gate of the third N-channel MOS transistor.

10. The input/output circuit of claim 9, wherein
the fourth diode element includes two diode-connected MOS transistors connected together in series.

11. The input/output circuit of claim 8, wherein
the third N-channel MOS transistor has a gate width of 1 µm or less.

12. The input/output circuit of claim 1, wherein
the first diode element includes three diode-connected MOS transistors connected together in series,
the second diode element includes three diode-connected MOS transistors connected together in series,
the third diode element includes one diode-connected MOS transistor.

13. The input/output circuit of claim 12, wherein
the MOS transistors included in the first, second, and third diode elements all have the same gate length and gate width.

14. The input/output circuit of claim 1, wherein
the first N-channel MOS transistor includes two N-channel MOS transistors connected together in series.

15. The input/output circuit of claim 1, further comprising:
an ESD protective circuit provided between the external connection pad and the ground line.

16. The input/output circuit of claim 15, wherein
the ESD protective circuit includes a bipolar transistor.

17. The input/output circuit of claim 15, wherein
the ESD protective circuit includes a thyristor circuit.

* * * * *

UNITED STATES PATENT AND TRADEMARK OFFICE
CERTIFICATE OF CORRECTION

| | | |
|---|---|---|
| PATENT NO. | : 8,395,870 B2 | Page 1 of 1 |
| APPLICATION NO. | : 13/289696 | |
| DATED | : March 12, 2013 | |
| INVENTOR(S) | : Masato Maede | |

It is certified that error appears in the above-identified patent and that said Letters Patent is hereby corrected as shown below:

Title Page, Col. 2, item [56], References Cited

--  US 6,781,805  -- should be inserted.

Signed and Sealed this
Twenty-third Day of July, 2013

Teresa Stanek Rea
*Acting Director of the United States Patent and Trademark Office*